(12) United States Patent
Suemasa

(10) Patent No.: US 11,837,482 B2
(45) Date of Patent: Dec. 5, 2023

(54) SUBSTRATE HOLDING AND ROTATION MECHANISM AND SUBSTRATE PROCESSING APPARATUS

(71) Applicant: EBARA CORPORATION, Tokyo (JP)

(72) Inventor: Shuichi Suemasa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 203 days.

(21) Appl. No.: 17/407,295

(22) Filed: Aug. 20, 2021

(65) Prior Publication Data

US 2022/0059378 A1    Feb. 24, 2022

(30) Foreign Application Priority Data

Aug. 24, 2020 (JP) ................................ 2020-140614

(51) Int. Cl.
*H01L 21/673* (2006.01)
*H01L 21/687* (2006.01)

(52) U.S. Cl.
CPC .. *H01L 21/67346* (2013.01); *H01L 21/68721* (2013.01); *H01L 21/68785* (2013.01)

(58) Field of Classification Search
CPC ......... H01L 21/67346; H01L 21/68721; H01L 21/68785; H01L 21/67046; H01L 21/67051; H01L 21/68728; H01L 21/67219

See application file for complete search history.

(56) References Cited

U.S. PATENT DOCUMENTS

| | | | | |
|---|---|---|---|---|
| 5,725,414 A | * | 3/1998 | Moinpour | H01L 21/67028 451/63 |
| 5,794,299 A | * | 8/1998 | Gockel | H01L 21/67772 15/21.1 |
| 5,861,066 A | * | 1/1999 | Moinpour | H01L 21/67046 15/97.1 |
| 5,868,857 A | * | 2/1999 | Moinpour | B24B 9/065 15/97.1 |
| 5,901,399 A | * | 5/1999 | Moinpour | H01L 21/67046 15/21.1 |

(Continued)

FOREIGN PATENT DOCUMENTS

| | | | | |
|---|---|---|---|---|
| JP | 2003-282516 A | 10/2003 | | |
| WO | WO-9936196 A1 | * 7/1999 | ............... | B08B 1/04 |

OTHER PUBLICATIONS

KR 20140082256 (Year: 2014).*

*Primary Examiner* — Alexander Markoff
(74) *Attorney, Agent, or Firm* — PEARNE & GORDON LLP

(57) ABSTRACT

A substrate holding and rotation mechanism includes: a substrate holding roller that holds a peripheral portion of the substrate and rotates the substrate, the substrate holding roller including, a lower portion of the roller facing the lower surface of the peripheral portion of the substrate, an upper portion of the roller facing the upper surface of the peripheral portion of the substrate, and a clamping groove which is provided between the lower portion of the roller and the upper portion of the roller and into which the peripheral portion of the substrate is inserted; and a roller washing nozzle that injects a fluid from diagonally above the substrate holding roller to an area including the clamp groove and an upper surface of the upper portion of the roller.

8 Claims, 13 Drawing Sheets

(56) References Cited

U.S. PATENT DOCUMENTS

| | | | | |
|---|---|---|---|---|
| 5,924,154 | A  * | 7/1999 | Gockel | B08B 1/04 15/21.1 |
| 6,550,091 | B1 * | 4/2003 | Radman | B08B 1/04 15/88.1 |
| 6,594,847 | B1 * | 7/2003 | Krusell | H01L 21/67051 15/103.5 |
| 6,910,240 | B1 * | 6/2005 | Boyd | H01L 21/67046 |
| 2002/0022445 | A1 * | 2/2002 | Sotozaki | B08B 1/04 451/444 |
| 2005/0139240 | A1 * | 6/2005 | Bong | B08B 3/02 134/179 |
| 2006/0234503 | A1 * | 10/2006 | Yamada | C23C 18/1628 257/E21.228 |
| 2007/0122559 | A1 * | 5/2007 | Shirakashi | G03F 7/3021 427/457 |
| 2007/0221256 | A1 * | 9/2007 | Chen | B08B 3/02 134/33 |
| 2008/0314870 | A1 * | 12/2008 | Inoue | B08B 1/04 118/58 |
| 2015/0034121 | A1 * | 2/2015 | Ishibashi | H01L 21/67046 15/103.5 |
| 2020/0203191 | A1 * | 6/2020 | Ro | H01L 21/02074 |
| 2022/0406633 | A1 * | 12/2022 | Matsuda | H01L 21/67051 |

\* cited by examiner

SUBSTRATE HOLDING AND ROTATION MECHANISM AND SUBSTRATE PROCESSING APPARATUS

CROSS-REFERENCE TO RELATED APPLICATIONS

The present application claims priority based on Japanese Patent Application No. 2020-140614 filed in Japan on Aug. 24, 2020, the contents of which are incorporated herein by reference.

BACKGROUND OF THE INVENTION

Field of the Invention

The present invention relates to a substrate holding and rotation mechanism and a substrate processing apparatus.

Background Art

Conventionally, substrate polishing apparatuses that perform chemical mechanical polishing (CMP) to flatten the surface of a substrate, such as a silicon wafer, have been known. Such a substrate polishing apparatus includes a polishing portion that polishes the substrate and a washing portion that washes and dries the polished substrate. In the polishing portion, the residue of the slurry used for CMP and metal polishing debris adhere to the polished substrate as fine particles (foreign matters).

Japanese Patent Application, First Publication No. 2003-282516 discloses a substrate holding and rotation mechanism that holds the peripheral portion of a substrate and rotates the substrate. The substrate holding and rotation mechanism has a substrate holding portion that holds the substrate horizontally and a rotation drive mechanism that rotates the substrate holding portion. The substrate holding portion is provided with chuck pins that hold the peripheral portions of the substrate. The chuck pin has a supporting portion that supports the lower surface of the peripheral portion of the substrate and a gripping portion that grips an end surface (peripheral surface) of the peripheral portion of the substrate.

If fine particles adhere and remain on the chuck pin, they may again adhere to the substrate. For this reason, the above-mentioned substrate rotation and holding mechanism has a configuration in which a washing nozzle is provided at approximately the same height as the support portion and the gripping portion, and a washing solution is injected horizontally from the washing nozzle toward the chuck pin to wash away the fine particles attached to the chuck pin.

However, a supporting portion and a gripping portion of the chuck pins in the above-described conventional technique face the rotation center of the substrate holding portion, and the washing solution injected horizontally from outside the substrate holding portion may not efficiently remove the fine particles adhered to the supporting portion and the gripping portion.

In addition, when droplets including fine particles adhere to the upper surface of the chuck pin, which is not exposed to the washing solution, the droplets cannot be washed away and may become a source of particles that contaminate the substrate.

SUMMARY OF THE INVENTION

The present invention was made in consideration of the above-mentioned circumstances, and provides a substrate holding and rotation mechanism and a substrate processing apparatus capable of washing the entire surface of the portion holding the substrate.

A substrate holding and rotation mechanism according to one or more aspects of the present invention includes: a substrate holding roller that holds a peripheral portion of the substrate and rotates the substrate, the substrate holding roller including, a lower portion of the roller facing the lower surface of the peripheral portion of the substrate, an upper portion of the roller facing the upper surface of the peripheral portion of the substrate, and a clamping groove which is provided between the lower portion of the roller and the upper portion of the roller and into which the peripheral portion of the substrate is inserted; and a roller washing nozzle that injects a fluid from diagonally above the substrate holding roller to an area including the clamp groove and an upper surface of the upper portion of the roller.

In the substrate holding and rotation mechanism according to one or more aspects of the present invention, the roller washing nozzle may have a slit-shaped injection hole, and may be switchable between a first mode in which the injection hole is set vertical and a fluid is injected to a region including the clamp groove and the upper surface of the upper portion of the roller and a second mode in which the injection hole is set horizontal and a fluid is injected to a region including the clamp groove and without including the upper surface of the upper portion of the roller.

In the substrate holding and rotation mechanism according to one or more aspects of the present invention, a nozzle holding portion that rotatably holds the roller washing nozzle may be provided where a slit is provided on the outer surface of the roller washing nozzle, and in an outer surface of the nozzle holding portion, a first slit arranged at a same rotation angle as the slit in the first mode and a second slit arranged at a same rotation angle as the slit in the second mode are provided.

In the substrate holding and rotation mechanism according to one or more aspects of the present invention, an actuator that is connected to the roller washing nozzle and performs switching between the first mode and the second mode may be provided.

In the substrate holding and rotation mechanism according to one or more aspects of the present invention, the roller washing nozzle may be provided that includes a first roller washing nozzle that injects pure water and a second roller washing nozzle that injects a chemical solution.

In the substrate holding and rotation mechanism according to one or more aspects of the present invention, the first roller washing nozzle may inject the pure water after injecting the chemical solution from the second roller washing nozzle is stopped.

In the substrate holding and rotation mechanism according to one or more aspects of the present invention, a control device rotating the substrate holding roller while a fluid is injected from the roller washing nozzle may be provided.

In the substrate holding and rotation mechanism according to one or more aspects of the present invention, the control device may rotate the substrate holding roller at a second speed lower than the first speed at which the substrate is washed while the fluid is injected from the roller washing nozzle.

In the substrate holding and rotation mechanism according to one or more aspects of the present invention, the lower portion of the roller may extend radially outward from the upper portion of the roller, and the roller washing nozzle may injects a fluid into a region comprising the clamp groove, an upper surface of the upper portion of the roller, and an upper surface of the lower portion of the roller.

A substrate processing apparatus according to one or more aspects of the present invention includes the substrate holding and rotation mechanism according to the above-described aspects.

According to one or more aspects of the present invention described above, a substrate holding and rotation mechanism and a substrate processing apparatus capable of washing the entire portion that holds the substrate can be provided.

DESCRIPTION OF THE PREFERRED EMBODIMENTS

An embodiment of the present invention is described below with reference to the drawings.

First Embodiment

Figure 1:
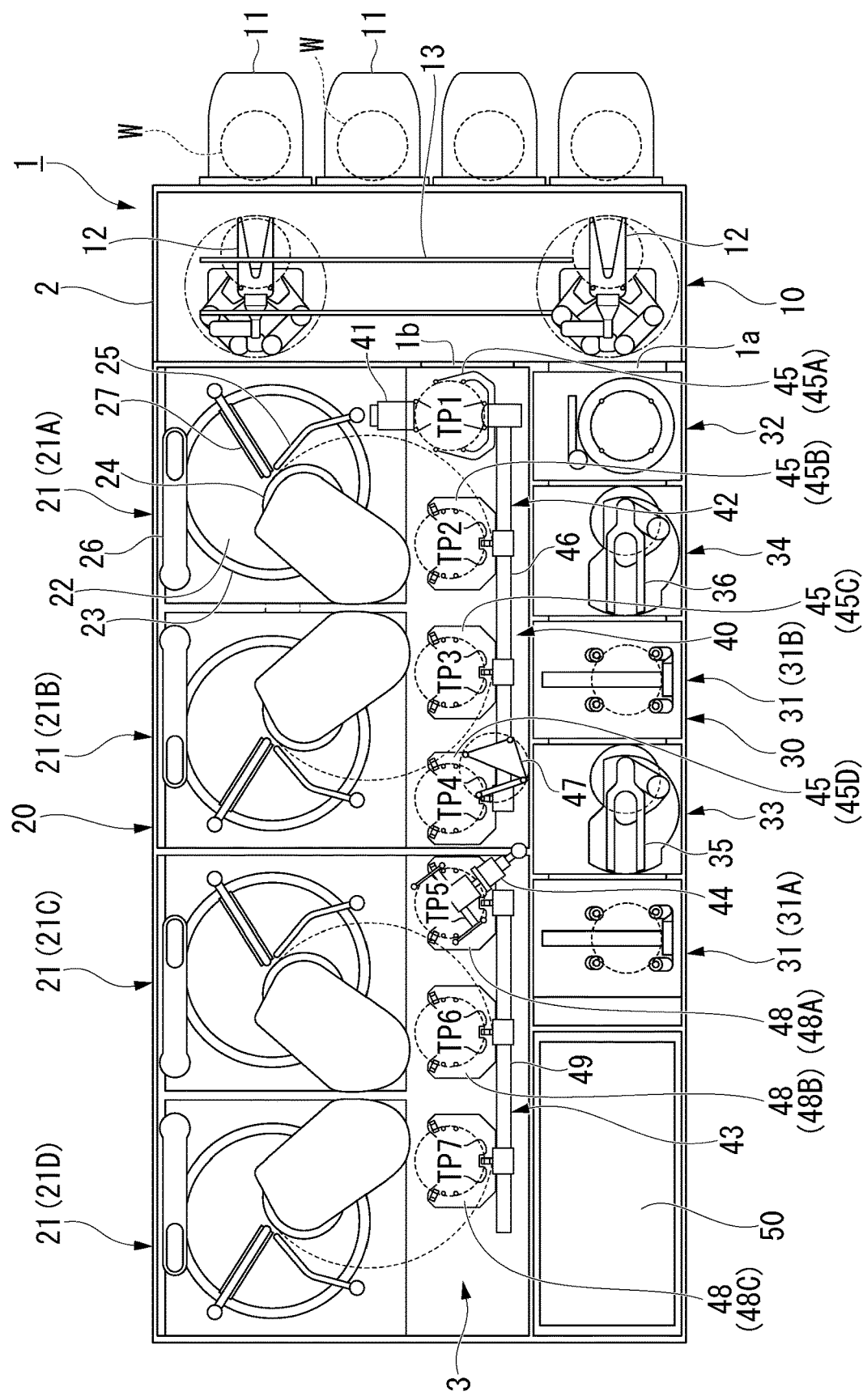
FIG. 1 is a plan view showing an overall configuration of a substrate processing apparatus of the first embodiment.

FIG. 1 is a plan view showing the overall configuration of the substrate processing apparatus 1 according to the first embodiment.

The substrate processing apparatus 1 shown in FIG. 1 is a chemical mechanical polishing (CMP) apparatus planarly polishing the surface of a substrate W, such as a silicon wafer. The substrate processing apparatus 1 includes a rectangular box-shaped housing 2. The housing 2 is formed in substantially rectangular in plan view.

The housing 2 includes a substrate transfer path 3 extending in a longitudinal direction in the center thereof. A loading/unloading portion 10 is installed at one end portion of the longitudinal direction (X direction in FIG. 1) of the substrate transfer path 3. On one side (in this case, the upper portion of the substrate transfer path 3) in the width direction (Z direction in FIG. 1, a direction perpendicular to the longitudinal direction in plan view) of the substrate transfer path 3, a polishing portion 20 is installed, and on the other side (in this case, the lower portion of the substrate transfer path 3), a washing portion 30 is installed. A substrate transfer portion 40 transferring a substrate W is provided in the substrate transfer path 3. The substrate processing apparatus 1 includes a controller (control device) 50 that comprehensively controls the operations of the loading/unloading portion 10, the polishing portion 20, the washing portion 30, and the substrate transfer portion 40.

The loading/unloading portion 10 includes front loading portions 11 that accommodate a substrate W. The plurality of front loading portions 11 are provided on a side surface of one side of the longitudinal direction of the housing 2 (i.e., the side surface of the loading/unloading portion 10). The plurality of front loading portions 11 are arranged in the width direction of the housing 2. In each front loading portion 11, for example, an open cassette, a Standard Manufacturing Interface (SMIF) pod, or a Front Opening Unified Pod (FOUP) is mounted. The SMIF and the FOUP are shield containers in which the cassette of the substrate W is housed and covered with a partition wall, and environment independence of the external space can be maintained.

The loading/unloading portion 10 includes two transfer robots 12 that load and unload substrates W from each front loading portion 11, and a traveling mechanism 13 that travels each transfer robot 12 along the line of the front loading portion 11. Each transfer robot 12 includes two hands, one above and one below, which are used properly before and after processing the substrate W. For example, the upper hand is used to return the substrate W to the front loading portion 11, and the lower hand is used to remove the substrate W before processing from the front loading portion 11.

The polishing portion 20 includes a plurality of substrate polishing devices 21 (21A, 21B, 21C, and 21D) that perform polishing (flattening) of the substrate W. The plurality of substrate polishing devices 21 are arranged in the longitudinal direction of the substrate transfer path 3. The substrate polishing system 21 includes a polishing table 23 that rotates a polishing pad 22 including a polishing surface, a top ring 24 that holds and polishes the substrate W while pressing the substrate W against the polishing pad 22 on the polishing table 23, a polishing fluid supply nozzle 25 that supplies the polishing fluid and dressing fluid (for example, pure water) to the polishing pad 22, and the dresser 26 that performs dressing of the polishing surface of the polishing pad 22, and the atomizer 27 that injects a mixture of fluid (for example, pure water) and gas (for example, nitrogen gas) or fluid (for example, pure water) into an atomized state onto the polishing surface.

The substrate polishing system 21 presses the substrate W against the polishing pad 22 by the top ring 24 while supplying the polishing fluid from the polishing fluid supply nozzle 25 onto the polishing pad 22, and further polishes the substrate W to flatten the surface thereof by moving the top ring 24 and the polishing table 23 relative to each other. In the dresser 26, hard particles such as diamond particles or ceramic particles are fixed to a rotation portion of the tip that contacts the polishing pad 22, and by rotating and oscillating the rotation portion, the entire polishing surface of the polishing pad 22 is uniformly dressed to form a flat polishing surface.

The atomizer 27 purifies the polishing surface by washing away polishing debris, abrasive grains, and the like, remaining on the polishing surface of polishing pad 22 with a high-pressure fluid, and performs polishing surface refinement work by dresser 26, which is a mechanical contact, i.e., regeneration of the polishing surface.

The washing portion 30 includes a plurality of substrate washing devices 31 (31A and 31B) washing the substrate W, and a substrate drying device 32 drying the washed substrate W. The plurality of substrate washing devices 31 and substrate drying devices 32 are arranged in the longitudinal direction of the substrate transfer path 3. A first transfer chamber 33 is provided between the substrate washing device 31A and the substrate washing device 31B. In the first transfer chamber 33, a transfer robot 35 is provided that transfers a substrate W among the substrate transfer portion 40, the substrate washing device 31A, and the substrate washing device 31B. In addition, a second transfer chamber 34 is provided between the substrate washing device 31B and the substrate drying device 32. In the second transfer chamber 34, a transfer robot 36 is provided that transfers the substrate W between the substrate washing device 31B and the substrate drying device 32.

The substrate washing device 31 includes a roll sponge-type washing module, for example, to scrub and wash the substrate W. The substrate washing device 31A and the substrate washing device 31B may include the same or different washing modules, for example, a pencil sponge-type washing module or a two-fluid jet-type washing module. The substrate drying device 32 includes a drying module that performs, for example, rotagoni drying (Iso-Propyl Alcohol (IPA) drying). After drying, the shutter 1a on the partition wall between the substrate drying device 32 and the loading/unloading portion 10 is opened, and the substrate W is removed from the substrate drying device 32 by the transfer robot 12.

The substrate transfer portion 40 includes a lifter 41, a first linear transporter 42, a second linear transporter 43, and a swing transporter 44. In the substrate transfer path 3, the first transfer position TP1, the second transfer position TP2, the third transfer position TP3, the fourth transfer position TP4, the fifth transfer position TP5, the sixth transfer position TP6, and the seventh transfer position TP7 are set in order from the loading/unloading portion 10.

The lifter 41 is a mechanism that transfers the substrate W up and down at the first transfer position TP1. The lifter 41 receives the substrate W from the transfer robot 12 of the loading/unloading portion 10 at the first transfer position TP1. The lifter 41 also receives the substrate W received from the transfer robot 12 and passes the substrate W to the first linear transporter 42. A shutter 1b is provided on the partition wall between the first transfer position TP1 and the loading/unloading portion 10, and when the substrate W is transferred, the shutter 1b is opened and the substrate W is passed from the transfer robot 12 to the lifter 41.

The first linear transporter 42 is a mechanism that transports the substrate W among the first transfer position TP1, the second transfer position TP2, the third transfer position TP3, and the fourth transfer position TP4. The first linear transporter 42 includes a plurality of transfer hands 45 (45A, 45B, 45C, and 45D) and a linear guide mechanism 46 that moves each transfer hand 45 horizontally at a plurality of heights. The transfer hand 45A moves from the first transfer position TP1 to the fourth transfer position TP4 by the linear guide mechanism 46. The transfer hand 45A is a pass hand that receives the substrate W from the lifter 41 and passes the substrate W to the second linear transporter 43.

The transfer hand 45B is moved between the first transfer position TP1 and the second transfer position TP2 by the linear guide mechanism 46. The transfer hand 45B receives the substrate W from the lifter 41 at the first transfer position TP1 and passes the substrate W to the substrate polishing device 21A at the second transfer position TP2. The transfer hand 45B is provided with a lifting and lowering drive portion, and is lifted when passing the substrate W to the top ring 24 of the substrate polishing device 21A, and is lowered after passing the substrate W to the top ring 24. The same lifting and lowering drive portion is provided for the transfer hand 45C and the transfer hand 45D.

The transfer hand 45C is moved between the first transfer position TP1 and the third transfer position TP3 by the linear guide mechanism 46. The transfer hand 45C receives the substrate W from the lifter 41 at the first transfer position TP1 and passes the substrate W to the substrate polishing device 21B at the third transfer position TP3. The transfer hand 45C also functions as an access hand to receive the substrate W from the top ring 24 of the substrate polishing device 21A at the second transfer position TP2 and to pass the substrate W to the substrate polishing device 21B at the third transfer position TP3.

The transfer hand 45D is moved between the second transfer position TP2 and the fourth transfer position TP4 by the linear guide mechanism 46. The transfer hand 45D functions as an access hand to receive the substrate W from the top ring 24 of the substrate polishing device 21A or the substrate polishing device 21B at the second transfer position TP2 or the third transfer position TP3 and to pass the substrate W to the swing transporter 44 at the fourth transfer position TP4.

The swing transporter 44 includes a hand that can be transferred between the fourth transfer position TP4 and the fifth transfer position TP5 to receive the substrate W from the first linear transporter 42 to the second linear transporter 43. The swing transporter 44 also passes the substrate W that has been polished in the polishing portion 20 to the washing portion 30. A temporary storage table 47 for the substrate W is provided at the side in the X-axis direction of the swing transporter 44. The swing transporter 44 reverses the substrate W received at the fourth transfer position TP4 or the fifth transfer position TP5 upside down and places the substrate W on the temporary placement table 47. The substrate W placed on the temporary storage table 47 is transported to the first transport chamber 33 by the transport robot 35 of the washing portion 30.

The second linear transporter 43 is a mechanism transporting the substrate W among the fifth transport position TP5, the sixth transport position TP6, and the seventh transport position TP7. The second linear transporter 43 includes a plurality of transfer hands 48 (48A, 48B, and 48C) and a linear guide mechanism 49 that transfers each transfer hand 45 horizontally at a plurality of heights. The transfer hand 48A is moved from the fifth transfer position TP5 to the sixth transfer position TP6 by the linear guide mechanism 49. The transfer hand 45A functions as an access hand that receives the substrate W from the swing transporter 44 and passes the substrate W to the substrate polishing device 21C.

The transfer hand 48B is moved between the sixth transfer position TP6 and the seventh transfer position TP7. The transfer hand 48B functions as an access hand that receives the substrate W from the substrate polishing device 21C and passes the substrate W to the substrate polishing device 21D. The transfer hand 48C moves between the seventh transfer position TP7 and the fifth transfer position TP5. The transfer hand 48C functions as an access hand to receive the substrate W from the top ring 24 of the substrate polishing device 21C or the substrate polishing device 21D at the sixth transfer position TP6 or the seventh transfer position TP7, and to pass the substrate W to the swing transporter 44 at the fifth transfer position TP5. Although the description is omitted, the operation of the transfer hand 48 when receiving and passing the substrate W is the same as the operation of the first linear transporter 42 described above.

Figure 2:
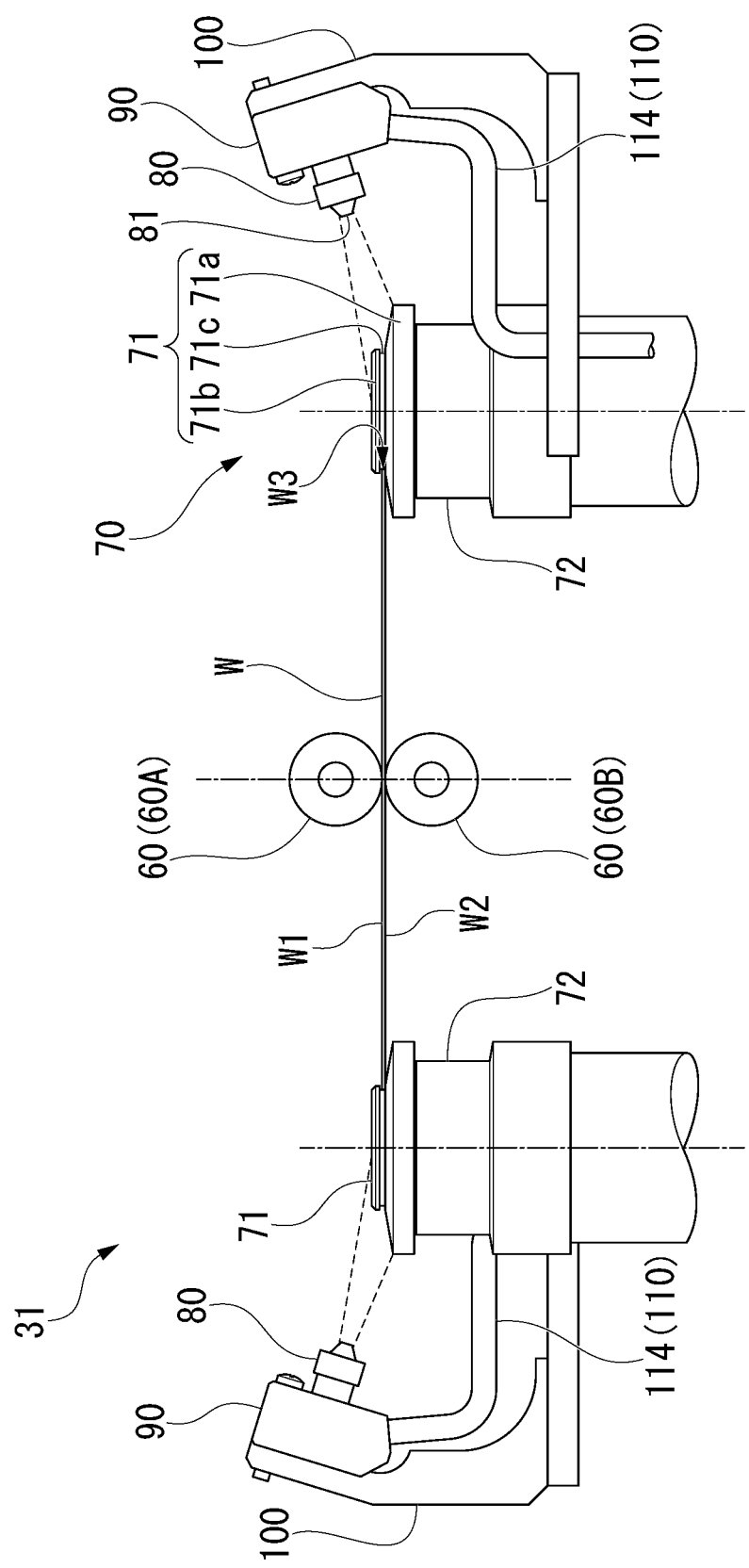
FIG. 2 is a side view showing a configuration of a substrate washing device according to the first embodiment.
Figure 3:
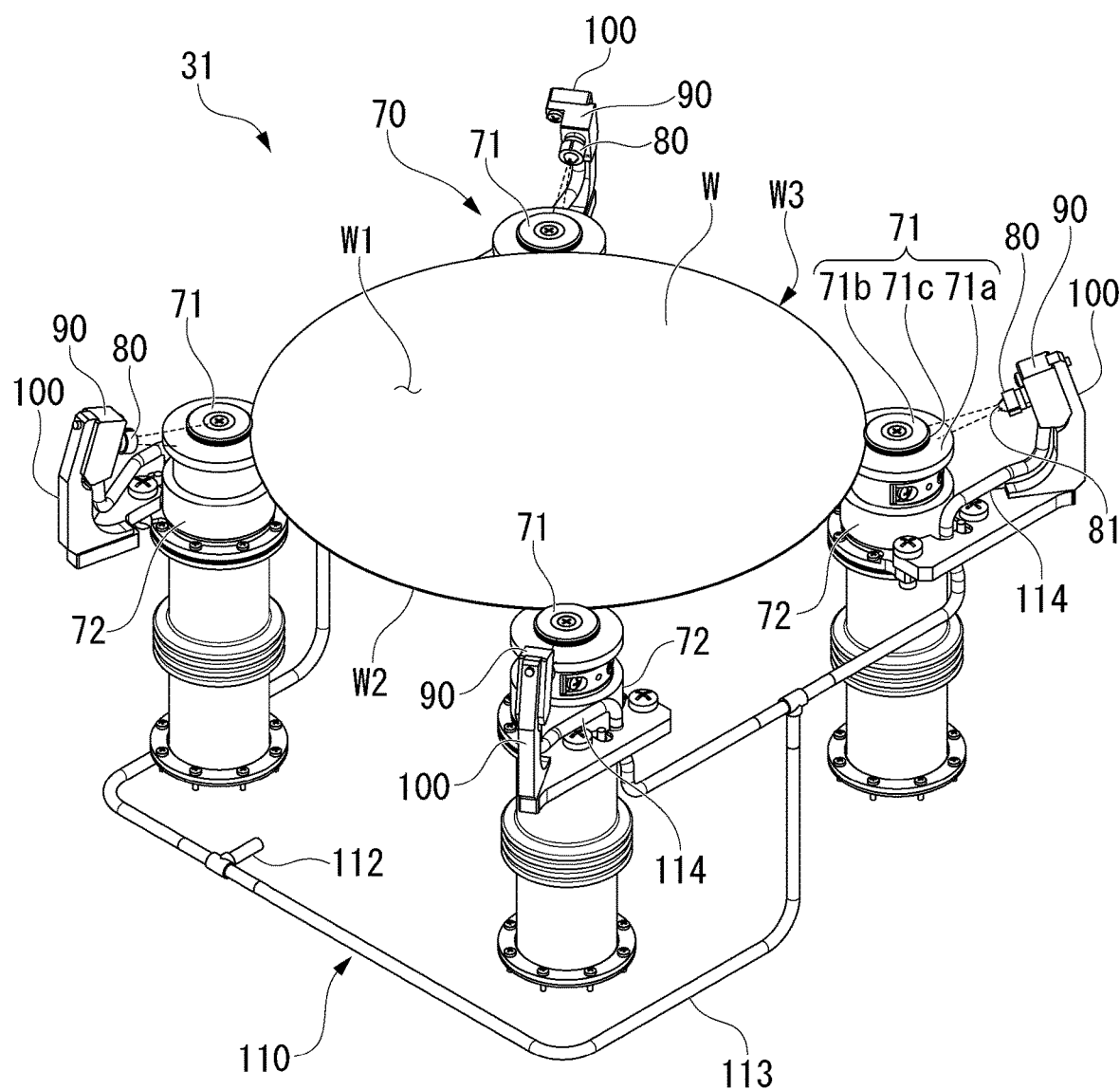
FIG. 3 is a perspective view showing a substrate holding and rotation mechanism according to the first embodiment.
Figure 4:
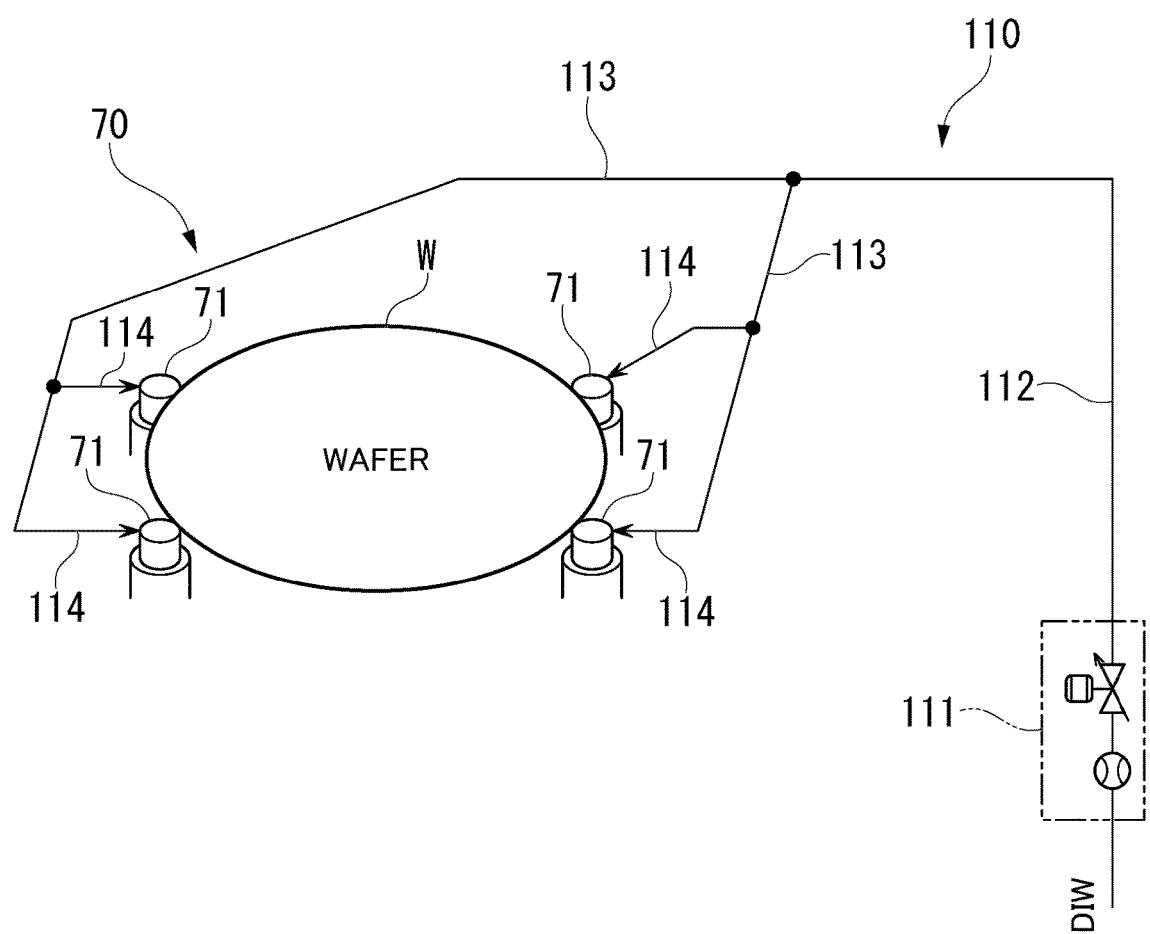
FIG. 4 is a system diagram showing a piping system connected to a roller washing nozzle according to the first embodiment.
Figure 5:
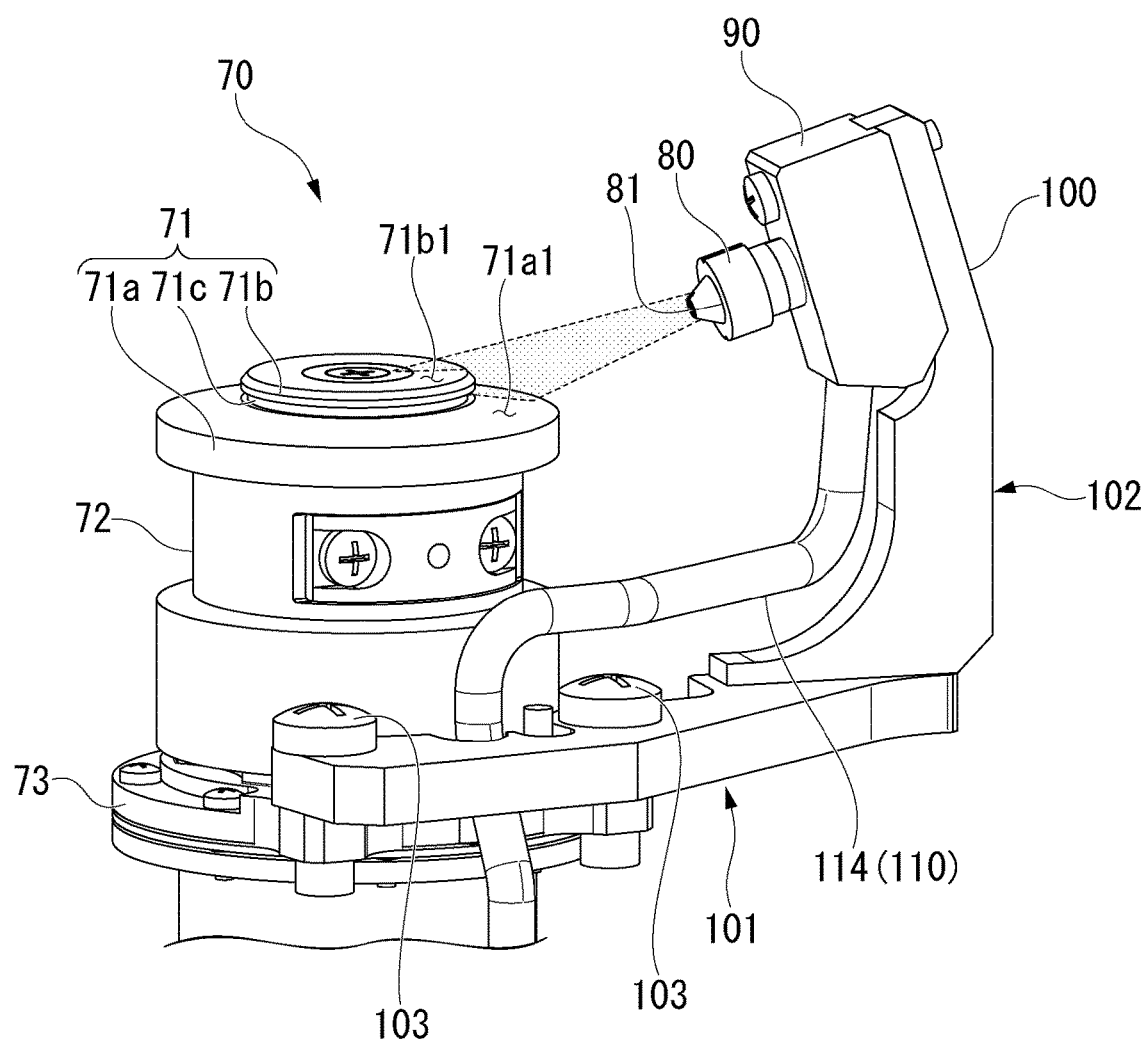
FIG. 5 is an enlarged perspective view of a main portion of the substrate holding and rotation mechanism according to the first embodiment.

FIG. 2 is a side view showing the configuration of the substrate washing device 31 according to the first embodiment. FIG. 3 is a perspective view showing the substrate holding and rotation mechanism 70 according to the first embodiment. FIG. 4 is a system diagram showing the piping system 110 connected to the roller washing nozzle 80 according to the first embodiment. FIG. 5 is an enlarged perspective view of the main portion of the substrate holding and rotation mechanism 70 according to the first embodiment.

As shown in FIG. 2, the substrate washing device 31 includes a roll washing member 60 scrubbing the substrate W, and a substrate holding and rotation mechanism 70 holding and rotating the substrate W.

The surface of the roll washing member 60 is formed, for example, from a polyvinyl alcohol (PVA) sponge or a urethane sponge. The roll washing member 60 includes an upper roll washing member 60A that contacts the upper surface (polishing surface) W1 of the substrate W, and a lower roll washing member 60B that contacts the lower surface W2 of the substrate W.

The upper roll washing member 60A and the lower roll washing member 60B are connected to an electric drive portion such as a motor to rotate. The upper roll washing member 60A can be moved up and down by an air drive portion (actuator) such as an air cylinder, which is not shown in the drawings. The lower roll washing member 60B may be held at a certain height.

The substrate holding and rotation mechanism 70 is provided with a plurality of substrate holding rollers 71 (four in the present embodiment) that hold the peripheral portion W3 of the substrate W and rotate the substrate W. The substrate holding rollers 71 include a roller lower portion 71a facing the lower surface W2 of the peripheral portion W3 of the substrate W, a roller upper portion 71b facing the upper surface W1 of the peripheral portion W3 of the substrate W, and a clamping groove 71c provided between the roller lower portion 71a and the roller upper portion 71b into which the peripheral portion W3 of the substrate W is inserted.

The substrate holding roller 71 is provided at the upper end of each of the four pillar portions 72, as shown in FIG. 3. The substrate holding rollers 71 are configured to be horizontally rotatable by an electric drive portion such as a motor, which is not shown in the drawings, installed in the pillar portion 72. The substrate holding rollers 71 are configured to be able to move up and down by an air drive portion such as an air cylinder, which is not shown in the drawings, installed in the pillar portion 72.

When setting the substrate W as shown in FIG. 2, first, the upper roll washing member 60A and the plurality of substrate holding rollers 71 are raised. Next, the substrate W is held in a horizontal position by the plurality of substrate holding rollers 71 that have been raised, and then lowered until the lower surface W2 of the substrate W contacts the lower roll washing member 60B. Finally, the upper roll washing member 60A is lowered to contact the upper surface W1 of the substrate W.

After the substrate W is set in such a manner, the foreign matters (fine particles) adhered to the upper surface W1 and the lower surface W2 of the substrate W are removed by rotating the pair of roll washing members 60 while the substrate W is rotated by the substrate holding roller 71. In the case of wet washing, a chemical solution and/or pure water is supplied from a nozzle not shown in the drawings toward the upper surface W1 of the substrate W, and the substrate W is scrubbed by the pair of roll washing members 60. As the chemical solution, SC1 (ammonia/hydrogen peroxide mixed solution) or the like can be used.

The substrate holding and rotation mechanism 70 includes roller washing nozzles 80 that wash away the fine particles adhered to the substrate holding rollers 71 after washing the substrate W as described above. The washing of the substrate holding roller 71 is performed, for example, after the washing of one lot of substrate W is completed and before the washing of the next lot of substrate W. The washing of the substrate holding roller 71 may be performed every time one substrate W is washed, or during a dummy dispensing of the substrate washing system 31 (periodically discharging the chemical solution and/or pure water accumulated in the piping system for washing the substrate W).

The roller washing nozzle 80 injects fluid from diagonally above the substrate holding roller 71 toward the substrate holding roller 71, as shown in FIG. 5. The roller washing nozzle 80 is held by the nozzle holding portion 90. The nozzle holding portion 90 is held by a holder 100 attached to the pillar portion 72. The holder 100 includes a horizontal portion 101 extending horizontally from the pillar portion 72 and a standing portion 102 rising from the horizontal portion 101.

The horizontal portion 101 is screwed to a flange 73 provided near an upper end portion of the pillar portion 72 via a bolt 103. The standing portion 102 rises from the horizontal portion 101 and holds the nozzle holding portion 90 at the upper end portion thereof. A piping system 110 that supplies pure water (DIW) to the roller washing nozzle 80 is connected to the nozzle holding portion 90.

As shown in FIG. 4, the piping system 110 is branched into four branches each corresponding to the four substrate holding rollers 71. In particular, the piping system 110 includes the valve device 111 that controls the supply/stop of pure water and the flow rate under appropriate injection conditions, the main pipe 112 provided with the valve device 111, the first branch pipe 113 branched into two branches from the main pipe 112, and the second branch pipe 114 further branched into two branches from each first branch pipe 113.

The second branch pipe 114 is connected to the nozzle holding portion 90 as shown in FIG. 5. The pure water supplied from the second branch pipe 114 passes through the inside of the nozzle holding portion 90 and is injected from the injection hole 81 of the roller washing nozzle 80 toward the substrate holding roller 71. The piping system 110 of the present embodiment is provided as a system different from the piping system for washing the substrate W described above. However, the piping system 110 for washing the substrate holding roller 71 may be formed by branching from the piping system washing the substrate W. In addition, the piping system 110 washing the substrate holding roller 71 may be formed by branching from the piping system for dummy dispensing. In these cases, the substrate holding roller 71 is washed when the substrate W is not washed.

As shown in FIG. 5, the roller washing nozzle 80 includes a slit-shaped injection hole 81. The injection hole 81 extends vertically and is configured to inject a fluid (pure water) in a fan shape. The roller washing nozzle 80 is configured to inject a fluid into a region of the substrate holding roller 71 including the clamp groove 71*c* and the upper surface 71*b*1 of the roller upper portion 71*b*. The upper surface 71*b*1 of the roller upper portion 71*b* has a flat surface.

The fluid injected from the roller washing nozzle 80 washes away the fine particles adhered to the clamp groove 71*c* of the substrate holding roller 71, and also washes away the fine particles adhered to the upper surface 71*b*1 of the roller upper portion 71*b*. In addition, since the fluid that has flowed down from the upper surface 71*b*1 of the roller upper portion 71*b* and the clamp groove 71*c* also washes away the fine particles adhered to the roller lower portion 71*a*, the portion of the substrate holding roller 71 that holds the substrate W can be entirely washed. The lower roller portion 71*a* extends radially outward from the roller upper portion 71*b*, and the upper surface 71*a*1 is a tapered surface that extends downward in the radial direction.

As shown in FIG. 5, the roller washing nozzle 80 injects fluid into a region including not only the clamp groove 71*c* and the upper surface 71*b*1 of the roller upper portion 71*b* but also the upper surface 71*a*1 of the roller lower portion 71*a*. As a result, the fine particles adhered to the upper surface 71*a*1 of the lower roller 71*a* can also be washed away by the water pressure of the fluid.

In addition, the controller 50 (see FIG. 1) rotates the substrate holding roller 71 while the fluid is injected from the roller washing nozzle 80 as described above. As a result, the fluid can be injected on the entire circumference of the substrate holding roller 71. At this time, the controller 50 rotates the substrate holding roller 71 at a second speed (for example, approximately ½ to ¼) lower than the first speed when washing the substrate W. As a result, the time required for the fluid to be applied per unit area of the substrate holding roller 71 becomes long, so that the fine particles fall off well. Although the controller 50 controls the overall operation of the substrate processing apparatus 1, a dedicated controller may be provided for the substrate holding and rotation mechanism 70.

As described above, according to the substrate holding and rotation mechanism 70 of the present embodiment described above, a configuration is employed such that the substrate holding and rotation mechanism 70 includes a substrate holding roller 71 that holds a peripheral portion W3 of the substrate W and rotates the substrate W, the substrate holding roller 71 including, a lower portion 71*a* of the roller facing the lower surface W2 of the peripheral portion W3 of the substrate W, an upper portion 71*b* of the roller facing the upper surface W1 of the peripheral portion W3 of the substrate W, and a clamping groove 71*c* which is provided between the lower portion 71*a* of the roller and the upper portion 71*b* of the roller and into which the peripheral portion W3 of the substrate W is inserted; and a roller washing nozzle 80 that injects a fluid from diagonally above the substrate holding roller 71 to an area including the clamp groove 71*c* and the upper surface 71*b*1 of the upper portion 71*b* of the roller. As a result, the portion of the substrate holding roller 71 that holds the substrate W can be entirely washed, and it can be prevented fine particles from again adhering to the substrate W.

Second Embodiment

Next, the second embodiment of the present invention will be described. In the following description, the same or equivalent configurations as those in the above-described embodiment are designated by the same reference numerals, and the description thereof will be simplified or omitted.

Figure 6:
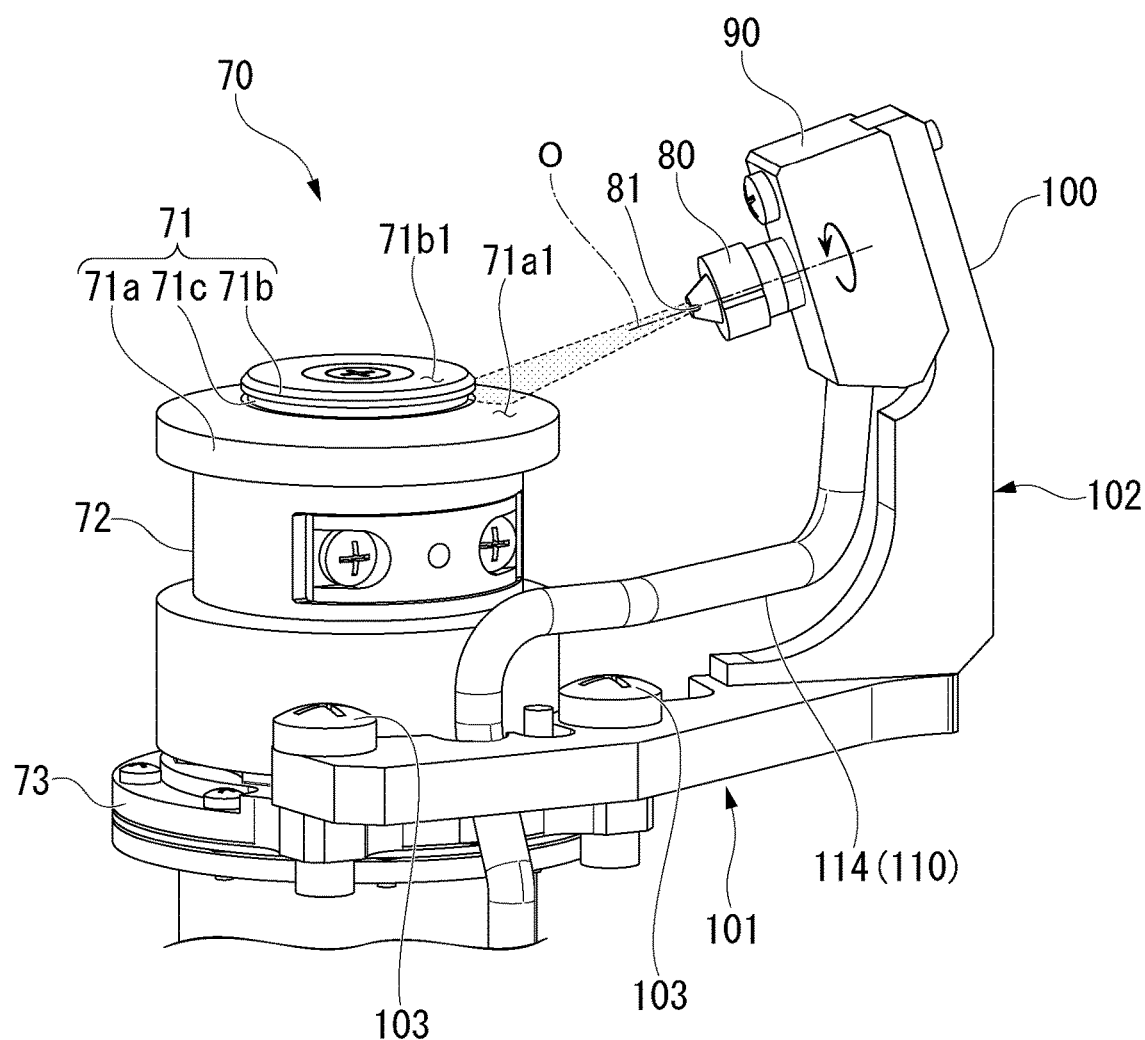
FIG. 6 is an enlarged perspective view of a main portion of the substrate holding and rotation mechanism according to the second embodiment.

FIG. 6 is an enlarged perspective view showing a main portion of the substrate holding and rotation mechanism 70 according to the second embodiment.

As shown in FIG. 6, the nozzle holding portion 90 of the second embodiment rotatably holds the roller washing nozzle 80. The roller washing nozzle 80 is rotatable around the central axis O passing through the center of the injection hole 81.

Similar to the above-described embodiment, such the roller washing nozzle 80 has a first mode (see FIG. 5) in which the injection hole 81 is set vertical and the fluid is injected into a region including the clamp groove 71*c* and the upper surface 71*b*1 of the roller upper portion 71*b* and a second mode (see FIG. 6) in which the injection hole 81 is set horizontal and the fluid is injected into a region including the clamp groove 71*c* and without including the upper surface 71*b*1 of the roller upper portion 71*b*, and the two injection modes are switchable.

According to the first mode, as described above, the portion of the substrate holding roller 71 that holds the substrate W can be entirely washed. In addition, according to the second mode, in the substrate holding roller 71, the clamp groove 71*c* in which fine particles are particularly likely to remain can be intensively washed. By switching between the first mode and the second mode in such a manner, the fine particles adhered to the substrate holding roller 71 can be efficiently washed.

Figure 7:
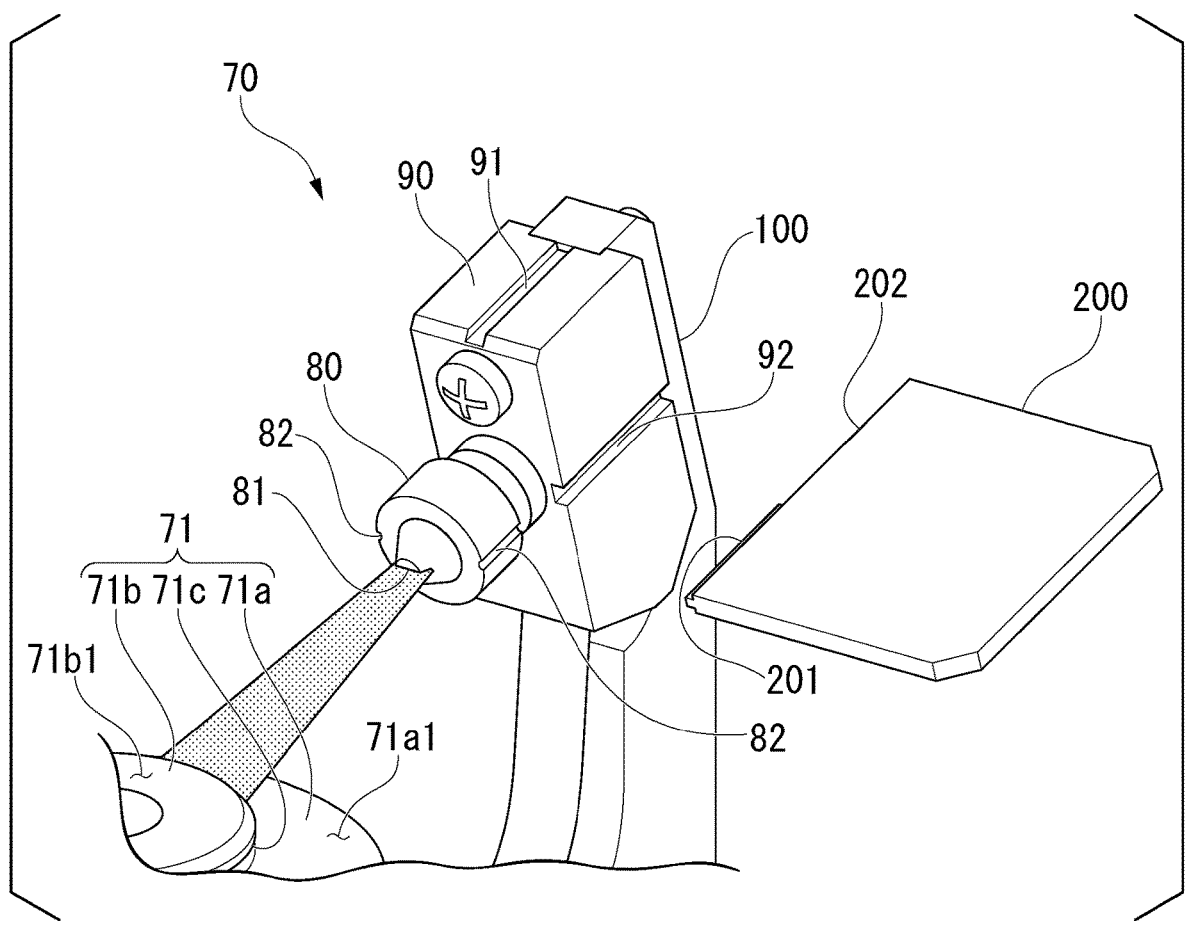
FIG. 7 is a perspective view showing a configuration that facilitates rotation angle adjustment (mode switching) of a roller washing nozzle according to the second embodiment.
Figure 8:
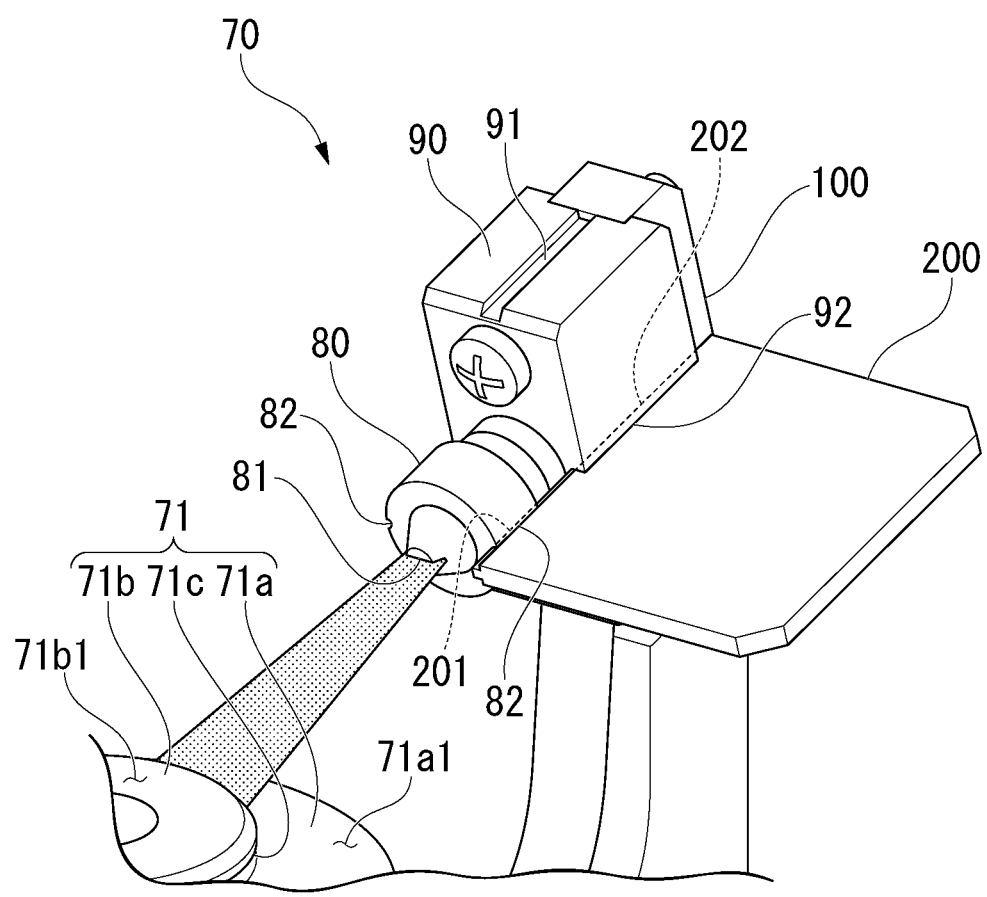
FIG. 8 is a perspective view showing a state of the rotation angle adjustment operation of the roller washing nozzle according to the second embodiment.
Figure 9:
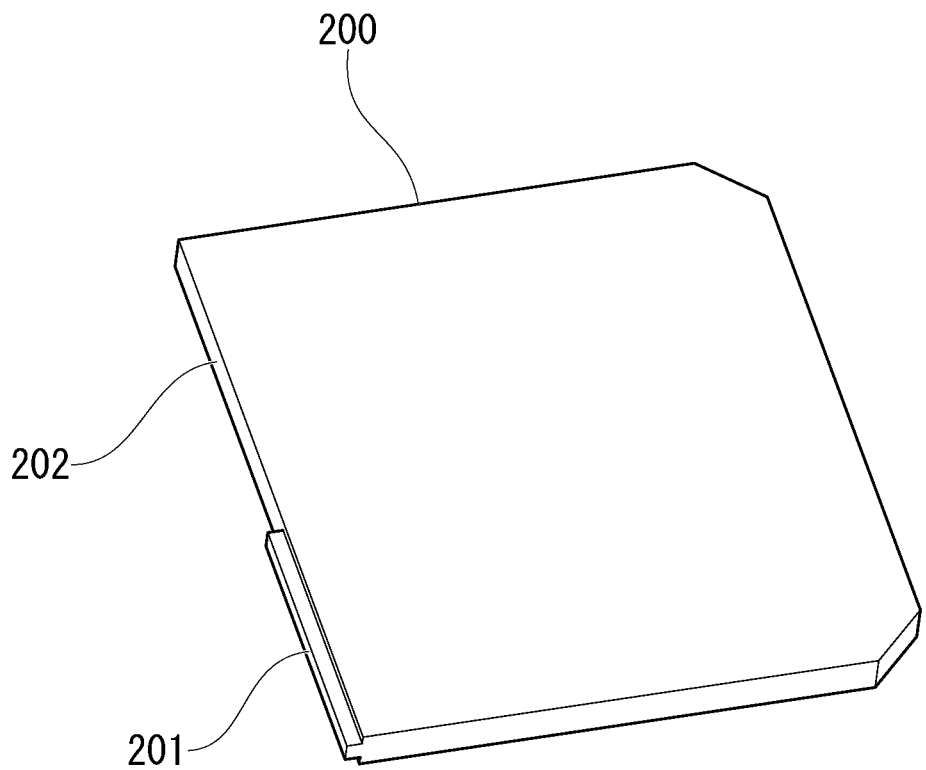
FIG. 9 is a perspective view showing a jig used in the rotation angle adjustment operation of the roller washing nozzle according to the second embodiment.

FIG. 7 is a perspective view showing a configuration that facilitates rotation angle adjustment (mode switching) of the roller washing nozzle 80 according to the second embodiment. FIG. 8 is a perspective view showing a state of the rotation angle adjustment operation of the roller washing nozzle 80 according to the second embodiment. FIG. 9 is a perspective view showing a jig 200 used in the rotation angle adjustment operation of the roller washing nozzle 80 according to the second embodiment.

As shown in FIG. 7, on the outer surface of the nozzle holding portion 90 of the second embodiment, a first slit 91 for switching the roller washing nozzle 80 to the first mode and a second slit 92 for switching the roller washing nozzle 80 to the second mode are preferably formed.

A slit 82 as a mark is provided on the outer surface of the roller washing nozzle 80. The slit 82 is provided on an extension line in the longitudinal direction (extending direction of the slit) of the injection hole 81. The first slit 91 of the nozzle holding portion 90 is provided on the upper surface of the nozzle holding portion 90 so that the roller washing nozzle 80 is arranged at the same rotation angle as the slit 82 when the roller washing nozzle 80 is in the first mode. In addition, the second slit 92 of the nozzle holding portion 90 is provided on the side surface of the nozzle holding portion 90 so that the roller washing nozzle 80 is arranged at the same rotation angle as the slit 82 when the roller washing nozzle 80 is in the second mode.

When adjusting the rotation angle of the roller washing nozzle 80 (mode switching), a plate-shaped jig 200 can be inserted as shown in FIG. 8. The jig 200 includes a first insertion portion 201 that can be inserted into the slit 82 of the roller washing nozzle 80, and a second insertion portion 202 that can be inserted into the first slit 91 or the second slit 92 of the nozzle holding portion 90. As shown in FIG. 9, the first insertion portion 201 is thinner than the second insertion portion 202 and protrudes more than the second insertion portion 202 (end surface of the jig 200).

For example, when switching the roller washing nozzle 80 to the second mode, as shown in FIG. 8, the first insertion portion 201 of the jig 200 is inserted into the slit 82 of the roller washing nozzle 80, and the second insertion portion 202 of the jig 200 is inserted into the second slit 92 of the nozzle holding portion 90. As a result, the injection mode of the roller washing nozzle 80 can be switched to the second mode. By inserting the jig 200, the slit 82 of the roller washing nozzle 80 and the second slit 92 of the nozzle holding portion 90 can be easily aligned on a straight line, and thus, the desired washing performance by the second mode can be obtained.

Third Embodiment

Next, a third embodiment of the present invention will be described. In the following description, the same or equivalent configurations as those in the above-described embodiment are designated by the same reference numerals, and the description thereof will be simplified or omitted.

Figure 10:
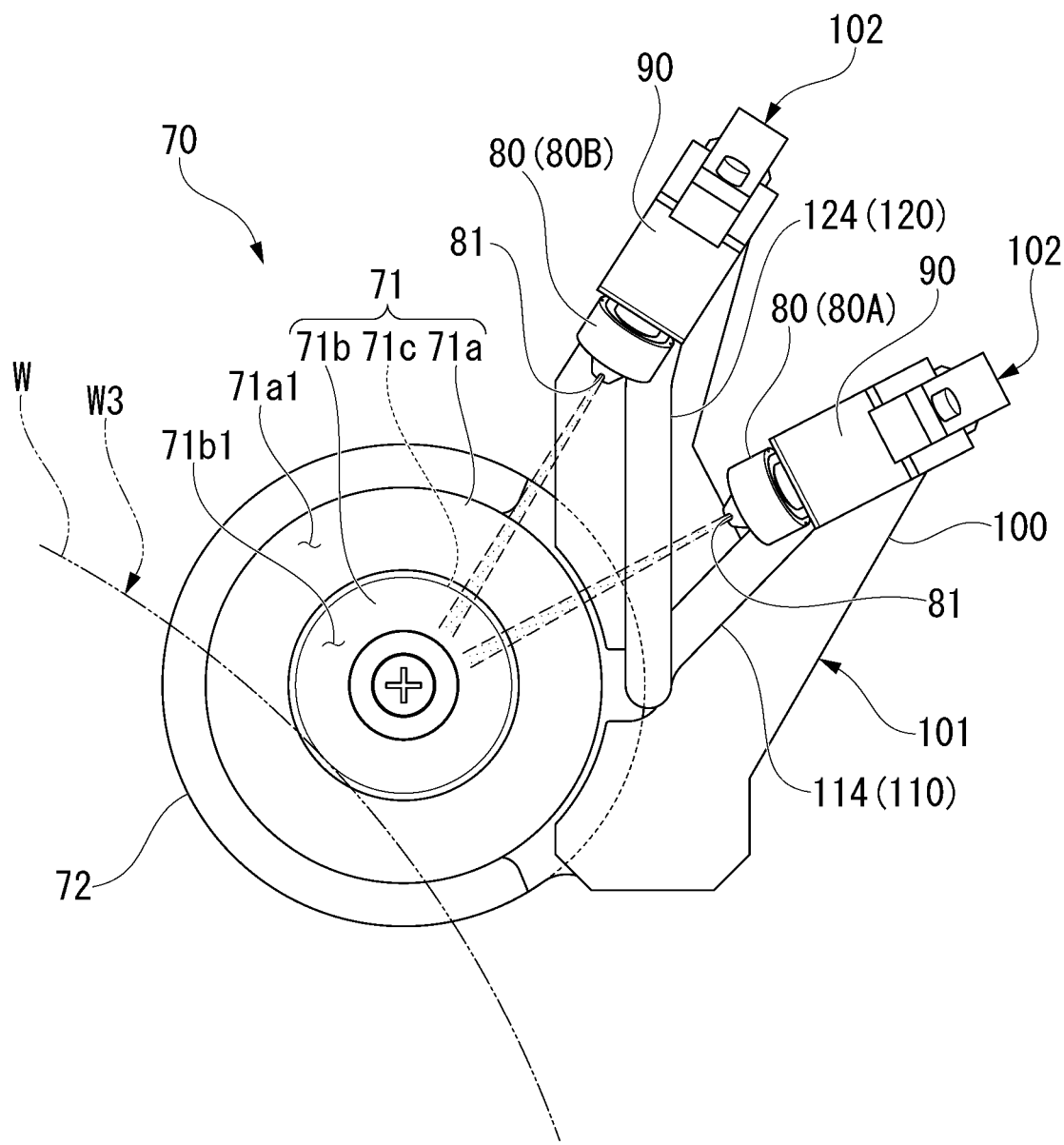
FIG. 10 is a plan view of a main portion of the substrate holding and rotation mechanism according to the third embodiment.
Figure 11:
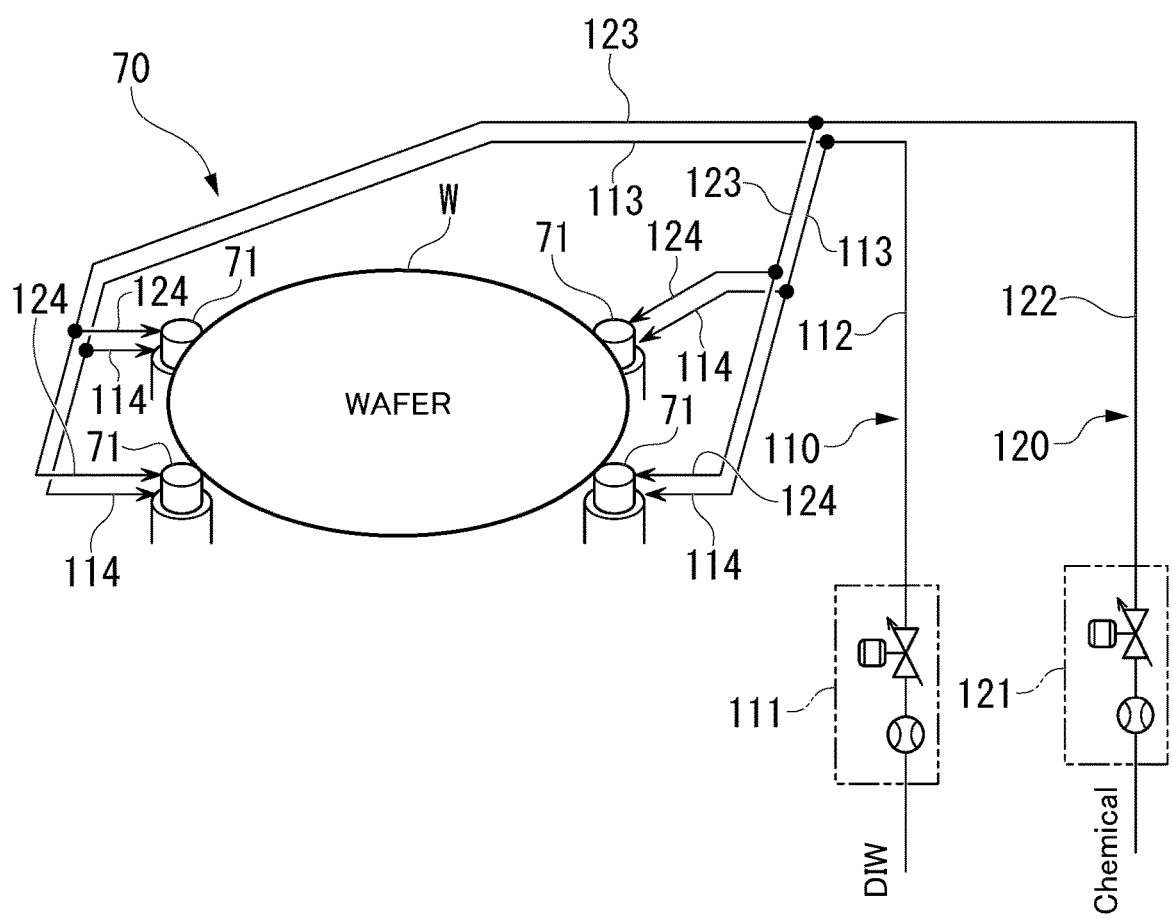
FIG. 11 is a system diagram showing piping systems connected to the first and second roller washing nozzles according to the third embodiment.

FIG. 10 is a plan view showing a main portion of the substrate holding and rotation mechanism 70 according to the third embodiment. FIG. 11 is a system diagram showing piping systems 110 and 120 connected to the first roller washing nozzle 80A and the second roller washing nozzle 80B according to the third embodiment.

As shown in FIG. 10, in the third embodiment, the roller washing nozzle 80 includes a first roller washing nozzle 80A injecting pure water and a second roller washing nozzle 80B injecting a chemical solution. As the chemical solution to be injected from the second roller washing nozzle 80B, SC1 (ammonia/hydrogen peroxide mixed aqueous solution) or the like can be used in the same manner as the chemical solution for washing the substrate W.

The first roller washing nozzle 80A and the second roller washing nozzle 80B are configured to inject fluid from diagonally above the substrate holding roller 71 into a region including the clamp groove 71c and the upper surface 71b1 of the roller upper portion 71b, respectively. The piping system 110 for supplying the above-mentioned pure water is connected to the first roller washing nozzle 80A. In addition, a piping system 120 for supplying a chemical solution is connected to the second roller washing nozzle 80B.

As shown in FIG. 11, the piping system 120 for supplying the chemical solution is also branched into four branches corresponding to the four substrate holding rollers 71, similarly to the piping system 110 for supplying pure water. In particular, the piping system 120 includes the valve device 121 that controls the supply/stop of the chemical solution and the flow rate under appropriate injection conditions, the main pipe 122 provided with the valve device 121, the first branch pipe 123 branched into two branches from the main pipe 122, and the second branch pipe 124 further branched into two branches from each first branch pipe 123.

As shown in FIG. 10, the second branch pipe 124 is connected to the nozzle holding portion 90 of the second roller washing nozzle 80B. The chemical solution supplied from the second branch pipe 124 passes through the inside of the nozzle holding portion 90 of the second roller washing nozzle 80B, and is injected from the injection hole 81 of the second roller washing nozzle 80B toward the substrate holding roller 71. The piping system 120 of the present embodiment is provided as a system different from the piping system of the chemical solution for washing the substrate W described above. However, the piping system 120 for washing the substrate holding roller 71 may be formed by branching from the piping system for the chemical solution for washing the substrate W. In addition, the piping system 120 for washing the substrate holding roller 71 may be formed by branching from the piping system for dummy dispensing. In these cases, the substrate holding roller 71 is washed when the substrate W is not washed.

According to the above configuration, the fluid to be injected to the substrate holding roller 71 can be switched between pure water and a chemical solution for washing. For example, pure water may be injected from the first roller washing nozzle 80A after the injection of the chemical solution from the second roller washing nozzle 80B is stopped. This makes it possible to rinse the substrate holding roller 71 washed with the chemical solution with pure water. By switching the fluid in the order of the chemical solution and the pure water in such a manner, the fine particles adhered to the substrate holding roller 71 can be removed by the chemical solution, and the chemical solution adhered to the substrate holding roller 71 can be washed away with pure water. The chemical solution and pure water may be injected at the same time; however, since the chemical solution is diluted with pure water, it is preferable to inject them individually.

Figure 12:
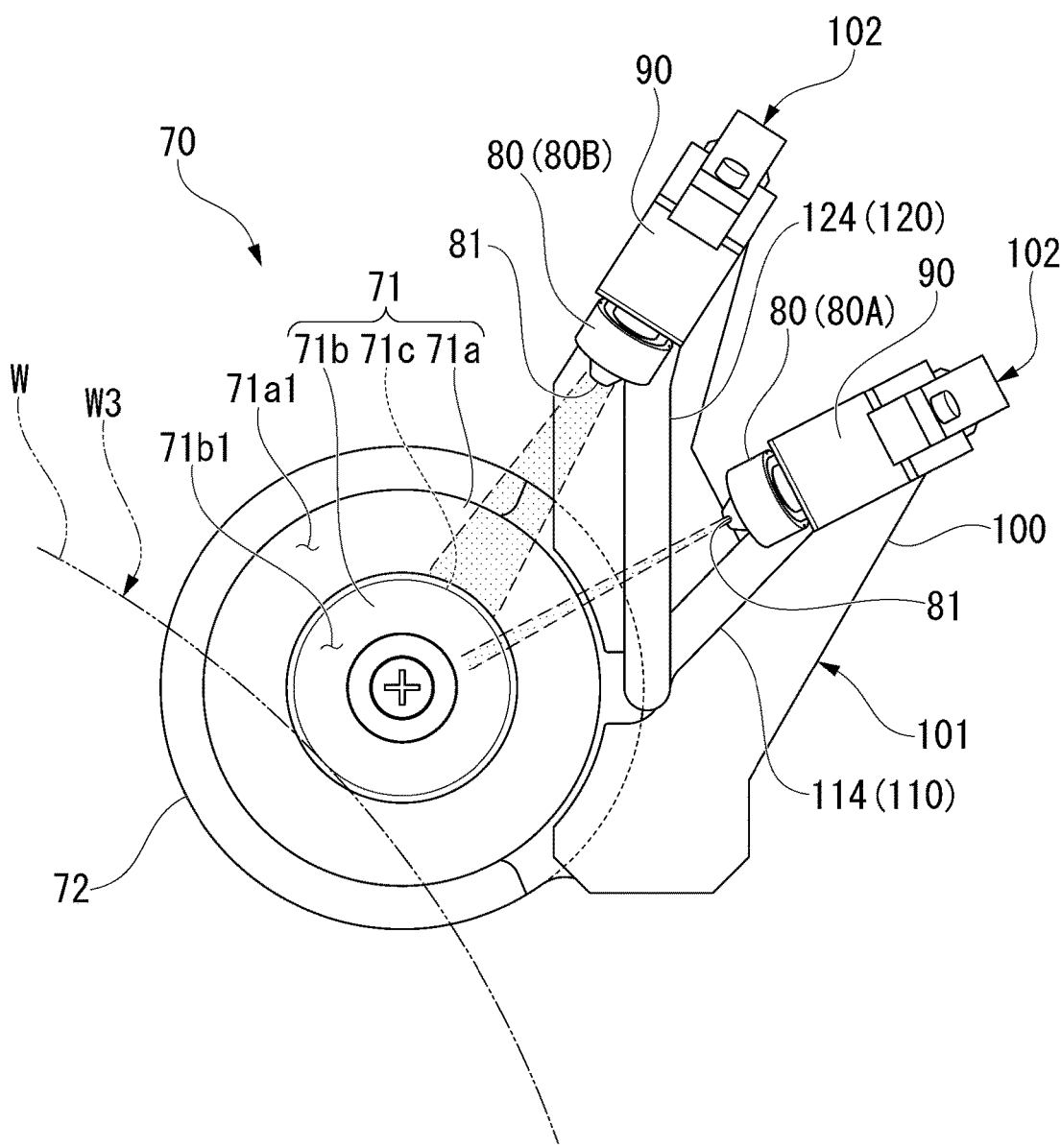
FIG. 12 is a plan view showing a modification example of the substrate holding and rotation mechanism according to the third embodiment.

FIG. 12 is a plan view showing a modification example of the substrate holding and rotation mechanism 70 according to the third embodiment.

In the third embodiment, as shown in FIG. 12, the first roller washing nozzle 80A may be set to the first mode, and the second roller washing nozzle 80B may be set to the second mode. According to such a configuration, the clamp groove 71c in which fine particles are particularly likely to remain in the substrate holding roller 71 can be intensively washed away with chemical solution, and the substrate holding roller 71 can be entirely washed away with pure water. In this case as well, it is preferable to rinse the substrate holding roller 71 with pure water after washing with the chemical solution as described above.

Fourth Embodiment

Next, a fourth embodiment of the present invention will be described. In the following description, the same or equivalent configurations as those in the above-described embodiment are designated by the same reference numerals, and the description thereof will be simplified or omitted.

Figure 13:
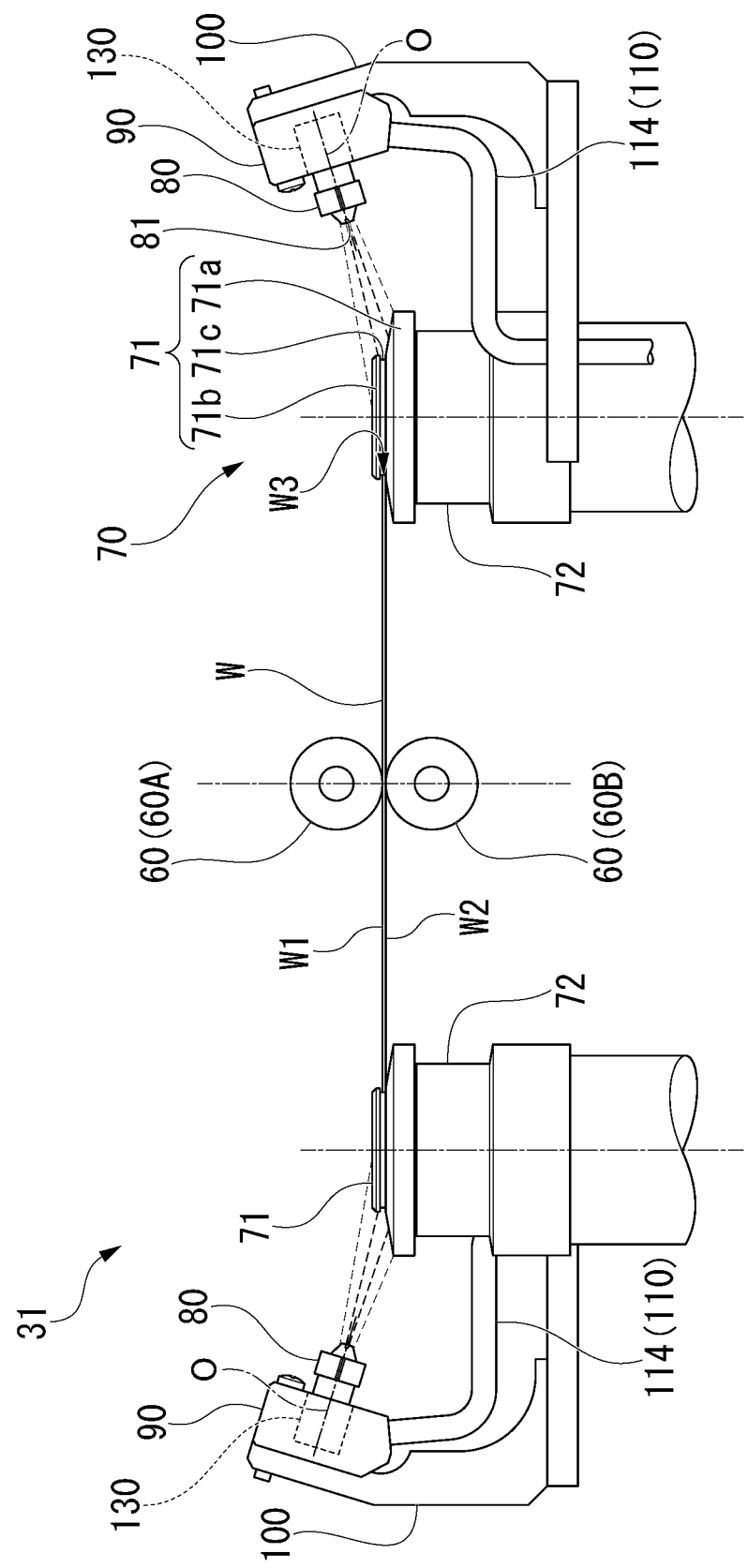
FIG. 13 is a side view showing a configuration of the substrate holding and rotation mechanism according to the fourth embodiment.

FIG. 13 is a side view showing the configuration of the substrate holding and rotation mechanism 70 according to the fourth embodiment.

As shown in FIG. 13, in the fourth embodiment, an actuator 130 is provided that is connected to the roller washing nozzle 80 and switches between the first mode and the second mode described above. The actuator 130 includes, for example, an electric drive portion such as a motor and a speed reducer such as a worm gear, and automatically adjusts the rotation angle of the roller washing nozzle 80.

According to the above-described configuration, as shown in FIG. 12 described above, one roller washing nozzle 80 can switch between washing by the first mode and washing by the second mode without providing two roller washing nozzles 80. In addition, if the piping system 120 for the chemical solution is connected to the nozzle holding portion 90 in addition to the piping system 110 for pure water, it is possible to switch between the chemical solution and pure water from the same roller washing nozzle 80. For example, it is possible to inject a chemical solution in the second mode to wash the clamp groove 71c, then to switch to the first mode and rinse the entire surface of the substrate holding roller 71 with pure water.

Although the preferred embodiments of the present invention have been described, it should be understood that these are exemplary of the present invention and should not be considered as limitation. Additions, omissions, substitutions, and other modifications can be made without departing from the scope of the invention. Therefore, the present invention should not be considered limited by the above description, but is limited by the claims.

For example, the above-described embodiment illustrates a CMP apparatus as a substrate processing apparatus to which the substrate holding and rotation mechanism of the present invention is applied; however, it may be applied to apparatuses other than a CMP apparatus (for example, a back grinding device, a bevel polishing device, an etching device, or a plating device).

The invention claimed is:

1. A substrate holding and rotation mechanism comprising:
   a plurality of substrate holding rollers that are provided at an upper end of each of a plurality of pillar portions and that are configured to hold a peripheral portion of a substrate and rotate the substrate,
   wherein each of the plurality of substrate holding rollers comprises,
      a roller lower portion facing a lower surface of the peripheral portion of the substrate,
      a roller upper portion facing an upper surface of the peripheral portion of the substrate, and
      a clamping groove which is provided between the roller lower portion and the roller upper portion and into which the peripheral portion of the substrate is inserted; and
   a roller washing nozzle that is provided diagonally above each of the plurality of substrate holding rollers and that is rotatably held by a nozzle holding portion, the nozzle holding portion comprising:
      a horizontal portion extending horizontally from each of the plurality of pillar portions; and
      a standing portion which rises from the horizontal portion, wherein the roller washing nozzle is switchable between:
         a first mode in which a direction where a slit-shaped injection hole of the roller washing nozzle extends is set vertical and a fluid is injected from diagonally above each of the plurality of substrate holding rollers into a region including the clamping groove and an upper surface of the roller upper portion; and
         a second mode in which the direction where the slit-shaped injection hole of the roller washing nozzle extends is set horizontal and the fluid is injected from diagonally above each of the plurality of substrate holding rollers into a region including the clamping groove and without including the upper surface of the roller upper portion.

2. The substrate holding and rotation mechanism according to claim 1, wherein:
   a slit is provided in an outer surface of the roller washing nozzle; and
   in an outer surface of the nozzle holding portion, a first slit arranged at a same circumferential position as the slit in the first mode and a second slit arranged at a same circumferential position as the slit in the second mode are provided.

3. The substrate holding and rotation mechanism according to claim 1, further comprising an actuator that is connected to the roller washing nozzle and performs switching between the first mode and the second mode.

4. A substrate holding and rotation mechanism comprising:
   a plurality of substrate holding rollers that are provided at an upper end of each of a plurality of pillar portions and that are configured to hold a peripheral portion of a substrate and rotate the substrate,
   wherein each of the plurality of substrate holding rollers comprises,
      a roller lower portion facing a lower surface of the peripheral portion of the substrate,
      a roller upper portion facing an upper surface of the peripheral portion of the substrate, and
      a clamping groove which is provided between the roller lower portion and the roller upper portion and into which the peripheral portion of the substrate is inserted;
   a first roller washing nozzle that is provided diagonally above each of the plurality of substrate holding rollers and that injects pure water; and
   a second roller washing nozzle that is provided diagonally above each of the plurality of substrate holding rollers and that injects a chemical solution, wherein
      each of the first roller washing nozzle and the second roller washing nozzle faces the same one of the plurality of substrate holding rollers and is held by a respective nozzle holding portion, the nozzle holding portion comprising:
         a horizontal portion extending horizontally from each of the plurality of the pillar portions; and
         a standing portion which rises from the horizontal portion.

5. The substrate holding and rotation mechanism according to claim 1, further comprising a control device rotating the plurality of substrate holding rollers while a fluid is injected from the roller washing nozzle.

6. The substrate holding and rotation mechanism according to claim 5, further comprising a roll washing member configured to wash the substrate by scrubbing, wherein the control device rotates the plurality of substrate holding rollers at a second speed lower than a first speed at which the substrate is washed by scrubbing while the fluid is injected from the roller washing nozzle.

7. The substrate holding and rotation mechanism according to claim 1, wherein:
   the roller lower portion extends radially outward from the roller upper portion; and
   the roller washing nozzle injects a fluid into a region comprising the clamping groove, an upper surface of the roller upper portion, and an upper surface of the roller lower portion.

8. A substrate processing apparatus comprising the substrate holding and rotation mechanism according to claim 1.

* * * * *